Figure 1A:
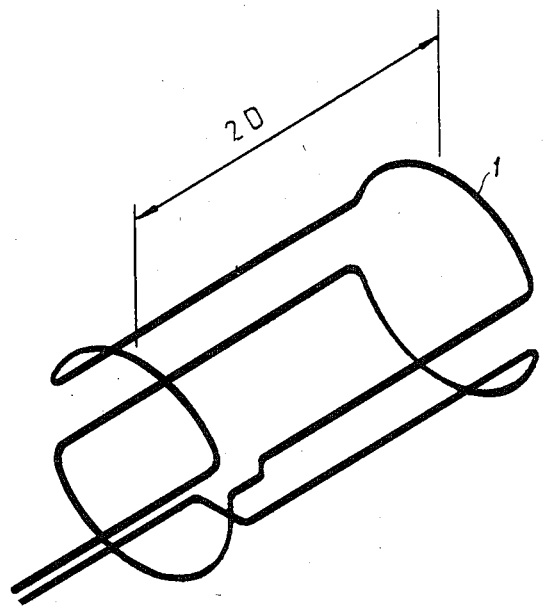

United States Patent [19]

Sepponen

[11] Patent Number: 4,587,493
[45] Date of Patent: May 6, 1986

[54] COIL ARRANGEMENT
[75] Inventor: Raimo Sepponen, Helsinki, Finland
[73] Assignee: Instrumentarium Oy, Helsinki, Finland
[21] Appl. No.: 510,350
[22] Filed: Jul. 1, 1983
[30] Foreign Application Priority Data
Jul. 7, 1982 [FI] Finland ................................. 822406
[51] Int. Cl.⁴ ............................................ G01N 27/00
[52] U.S. Cl. ...................................... 324/319; 336/20;
324/318
[58] Field of Search ............... 324/313, 314, 316, 318,
324/319, 320, 200, 260, 262; 336/20

[56] References Cited
U.S. PATENT DOCUMENTS
4,339,718  7/1982  Bull ..................................... 324/319
4,388,593  6/1983  Mittleman ........................... 324/262

Primary Examiner—Stewart J. Levy
Assistant Examiner—Robert R. Raevis
Attorney, Agent, or Firm—Bernard, Rothwell & Brown

[57] ABSTRACT

An adjustable signal coil, for example a solenoid, saddle or Helmholz type of signal coil which is used in a nuclear spin or NMR examination assembly, includes a pair of adjustable conductor guide and profile supports which hold one or more turns of a conductor forming the signal coil. The coil volume is changed by adjusting the supports to correspond to different sizes of targets to be positioned and examined inside the coil. In a disclosed embodiment, the coil volume is cylindrical and has its diameter changed by adjusting the spacing between the pair of supports, and the coil turn length and size, are adjusted by sliding guides within guideways of the supports.

5 Claims, 7 Drawing Figures

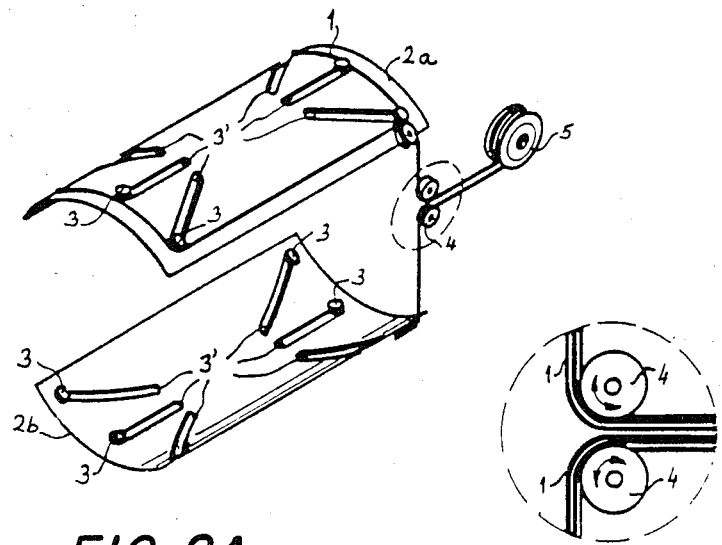
FIG. 2A
FIG. 2B
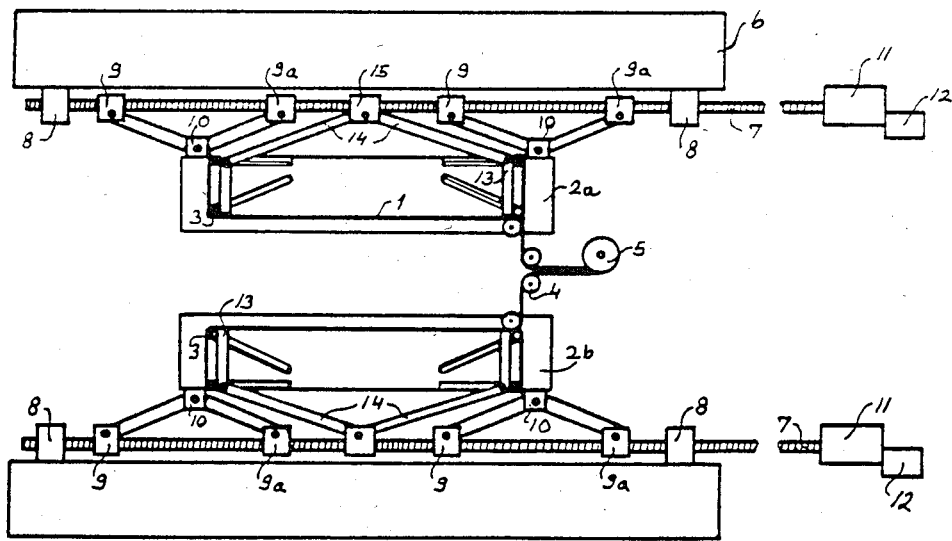
Fig. 3

COIL ARRANGEMENT

The present invention relates to a transmitter/receiver coil arrangement for a nuclear spin diagnostic apparatus.

Nuclear spin imaging is a new examination method that does not disrupt the material, one of the most important application fields being medical diagnostics. The principle of nuclear spin imaging was presented by P. Lauterbur in 1973. (Lauterbur: Nature vol. 242, Mar. 16, 1973, p. 190 . . . 191). Prior to this, R. Damadian had presented a sort of operating idea of an examination apparatus based on NMR (NMR=Nuclear Magnetic Resonance) phenomenon. (Damadian: U.S. Pat. No. 3,789,832). A plurality of nuclear spin imaging methods have been developed and described e.g. in references Ernst: U.S. Pat. No. 4,070,611, Garroway et al: U.S. Pat. No. 4,021,726 and Moore et al: U.S. Pat. No. 4,015,196.

Nuclear spin imaging, like other NMR examination methods, is based on the fact that the nuclei of certain elements have a magnetic moment. Such elements include e.g. hydrogen, fluorine, carbon and phosphorus, certain isotopes of such elements having a nuclear magnetic moment. For example, let us study the nucleus of a hydrogen atom, i.e. a proton, which is a positively charged elementary particle. A proton rotates around its own axis, i.e. it has a certain spin. The rotation generates the magnetic moment of a proton and also a flywheel moment aligned with the spin axis.

If a number of hydrogen atoms with randomly oriented nuclear magnetic moments are placed in an external magnetic field $B_o$, some of the magnetic moments of the nuclei will change to become aligned with said external field $B_o$, thus creating in the bunch of hydrogen atoms a net magnetization $M_n$ which is directly proportional to the external magnetic field $B_o$. However, the temperature of a target bunch of atoms effects the number of the nuclear magnetic moments that are shifted to generate the net magnetization, if compared to the entire bulk of said bunch of nuclei. For example, if the target temperature is that of a human body, the number of shifted magnetic moments will be approximately one millionth of the total nuclei of the entire bunch of nuclei. If the target temperature could be lowered, the net magnetization would increase in inverse proportions to the absolute temmperature of a target.

In pulse NMR examinations, the created net magnetization $M_n$ is is deflected by means of a powerful radiofrequency magnetic pulse 90° from the direction of said external magnetic field $B_o$. Due to the interaction between the flywheel moment as well as magnetic moment created by spin of the nuclei and the external field, the generated net magnetization will be set in precessinal motion. The angular speed of a precessive magnetic moment is directly proportional to the external magnetic field, as indicated by formula I $$W_o = \gamma B_o \quad (1)$$

wherein
 $\gamma$ is gyromagnetic ratio
 $B_o$ is the strength of an external magnetic field
 $W_o$ is a so-called Larmor frequency If there are placed outside the target an induction coil and a capacitor for setting up a resonance circuit, the precessive magnetization will induce a signal voltage in the terminals of said resonance circuit. The amplitude of signal voltage $V_s$ is directly proportional to the Q-factor or quality factor of the resonance circuit.

A measure more important than signal voltage is a signal/noise ratio SNR, the nuclear spin imaging similar to other NMR examinations depending on a signal/noise ratio that can be reached. If the electrical dissipations of a target to be examined are ignored, the signal/noise ratio will be:

$$SNR = kNAf(QW_o^3/LB)^{\frac{1}{2}} \quad (2)$$

wherein
 k is a constant independent of a field
 N is the speed of rotation of a detection coil
 A is the cross-sectional area of a coil
 f is a filling ratio $V_t/V_c$
 Q is the quality factor of a coil
 $W_o$ is Larmor frequency
 L is the inductance of a coil
 B is the band width applied
 $V_t$ is the volume of the target
 $V_c$ is the volume of the coil If the dissipations of coil and target are taken into consideration, it is possible to derive the expression (3) for a signal/noise ratio, as set forth in reference Hoult et al: Journal of Magnetic Resonance vol. 34, 199, p. 425 . . . 433.

$$SNR = \frac{\psi r^2}{[\alpha a^2 \psi r^{\frac{1}{2}} + \beta \psi r^2 b^5]^{\frac{1}{2}}} \quad (3)$$

$f_r$ = resonance frequency = $W_o/2\pi$
 $\alpha$ = a constant, depending on coil design
 $\beta$ = a constant, depending on coil design
 b = diameter of target
 a = diameter of coil As indicated in formula (3), it is preferable to minimize the ratio of the diameter of a coil to that of a target so as to maximize the filling ratio of a coil. The dependance of said filling ratio upon the coil diameter is in nuclear spin imaging equipment typically proportional to the third power of the coil radius since, with the coil radius increasing, the coil length must also increase to maintain homogeneity. On the other hand, with the target diameter increasing, the thickness of a slice to be imaged does not change.

According to the prior art technology, if for example medical diagnostics is effected by means of a nuclear spin imaging apparatus, the set of signal coils is replaced depending on a body member to be imaged. In one test assembly, for example, the diameter of a coil intended for imaging the head is 25 cm and that of a coil intended for imaging the rest of the body is 55 cm. (Crooks et al: Radiology, 143, April 1982, p. 169 . . . 174). In routine diagnostics, replacement of a set of coils between imaging sessions is inconvenient and, furthermore, is a waste of time for both the imaging equipment and medical staff. In addition, it is quite probable that members of a regular hospital staff won't possess the skills required for replacing a set of signal coils but, instead, the replacement must be carried out by experts having technical education and knowledge of the equipment.

An object of the invention is to eliminate the defects of the prior art and to provide a coil arrangement by means of which the signal coil of a nuclear spin diagnostic apparatus can be applied to targets of various sizes to be imaged or radiographed in a manner that, for example, the homogeneity of a signal coil field in the area to be imaged as well as the filling ratio can be optimized according to the size of a target. Another object of the invention is to provide a simple and reliably operating apparatus that can be operated without special-trained technical staff.

The arrangement according to the invention serves to provide a signal coil arrangement for a nuclear spin imaging apparatus, permitting readjustment of the volume of a set of signal coils in accordance with targets having different sizes or volumes to maintain an optimum filling ratio, i.e., ratio of target volume to coil volume, and to maintain the homogeneity of the signal coil field. By means of the arrangement of the invention, the readjustment of a signal coil diameter can be carried out without specially trained staff and in a manner that optimization occurs automatically, if so desired.

Figure 1B:
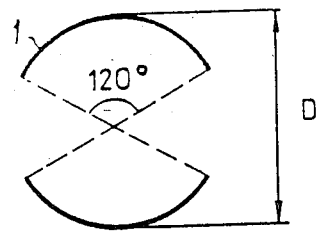
Figure 4A:
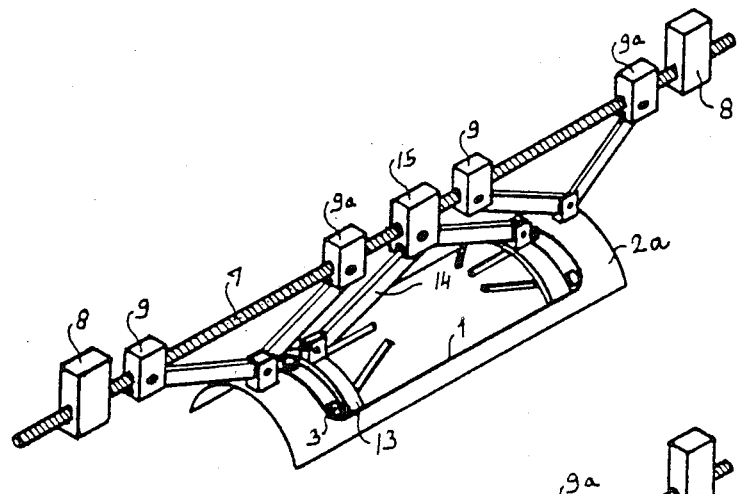
Figure 4B:
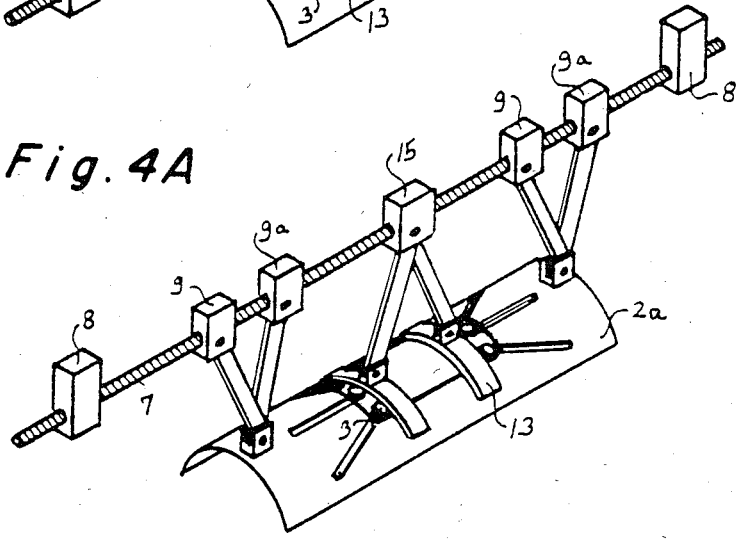
Figure 5:
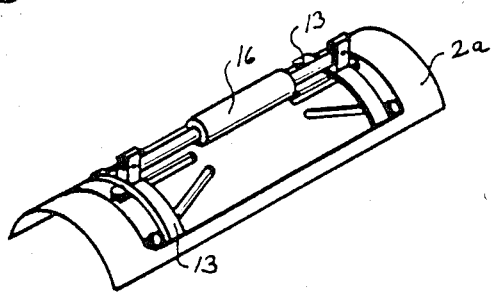

The invention will now be described in more detail with reference made to the accompanying drawing, in which FIG. 1A represents a general saddle coil embodiment, used particularly in connection with superconductor magnets, FIG. 1B is an end view of one preferred design of a signal coil, FIG. 2 shows one signal coil solution of the invention without means for readjusting its size, FIG. 3 shows the signal coil arrangement of FIG. 2 inserted within a solenoid-shaped magnet, FIGS. 4A and 4B depict the operation of the size adjusting means that are part of the embodiment of FIGS. 2 and 3, so that in FIG. 4A the signal coil is at its largest and in FIG. 4B at its smallest, FIG. 5 shows an alternative embodiment for the size adjusting means.

As illustrated in FIGS. 1 through 5, a coil arrangement of the invention comprises a conductor 1 serving as a signal coil, conductor guide and profile supports 2a and 2b, guides 3 that travel in guideways 3, a pair of compression rollers 4, a signal coil tightening means 5, a superconductor or conventional magnet 6, a conductor support and adjustment bar 7, suspension means 8 for said support and adjustment bar, threaded guides 9 and 9a, clamps 10 for the conductor guide and profile support 2, gearshifts 11, repeater or stepping motors 12, conductor size controllers 13, conductor size adjusting levers 14 and supports 15 for the adjusting levers. In addition, the alternative solution set out in FIG. 5 comprises hydraulic cylinders 16 or like power cylinders replacing the levers 14 and supports 15.

A so-called saddle winding is a general signal coil form in such nuclear spin examination equipment in which the direction of a magnetic field from the magnet 6 is parallel to the legthwise direction of a target to be examined. Such equipment includes typically nuclear spin or NMR imaging devices fitted with a super-conductor magnet. The optimum shape of a saddle coil is shown in FIGS. 1A and 1B wherein the coil windings define a cylindrical volume having a diameter D and a length 2D. The conductor material for a coil should be selected to be as highly conductive as possible, for example silver. In the present embodiment of the invention, for example, it is possible to use a thin-stranded, braided silver or copper conductor. In FIG. 2, such a conductor 1 has been positioned on top of guide and profile supports 2a and 2b in a manner that guides 3 and supports 2 as well as possible form said conductor 1 into a signal coil, shaped as the saddle coil shown in FIG. 1. Supports 2 are disposed inside a magnet 6 on the support and adjustment bars 7 that are suspended on said means 8.

The adjustment bars 7 are provided with a number of screw threads extending in different directions, the guides 9 and 9a being fitted pairwise relative of said screw threads. Thus, when bar 7 is turned, the movement of guides is such that, if the adjustment bar 7 is turned clockwise, guides 9 and 9a approach each other and, if the bar 7 is turned counter-clockwise, said guides draw away from each other. The relative movement of supports 9 results in the relative movement of the conductor guide and profile supports 2a and 2b in a manner that, when guides 9 and 9a are approaching each other, said supports 2a and 2b also approach each other and, when supports 9 and 9a are drawing away from each other, supports 2a and 2b also draw away from each other, to thus change the coil volume diameter.

Turning of the adjustment bars 7 is effected by means of repeater motors 12 through gearshifts 11. The repeater motors can be controlled e.g. by means of a microprocessor. In order to achieve an optimum coil geometry, it is also necessary to readjust not only the coil diameter but also the coil volume length. For this purpose, the solution according to the invention is provided with conductor size controllers 13, conductor size adjusting levers 14 and adjusting lever supports 15. The operation of these components is such that, when supports 2a 2b are moving as explained above, said controllers 13 move relative to each other forced by adjusting levers 14. If supports 2a and 2b are approaching each other, supports 13 also approach each other and the coil volume length decreases and the coil shape or design remains optimum with guides 3 moving in guideways 3' of supports 2a and 2b.

It is natural that, as the size of a coil changes, the length of a conductor used for the coil also changes. Therefore, the solution of the invention is provided with tightening means 5, for example a rotatable roller, as well as a pair of compression rollers 4. Tightening means 5 wind up all excessive conductor that is released as the coil size diminishes. A pair of compression rollers 4 ensures that the extra coil conductor winding on tightening means 5 is not part of the resonance circuit of a coil. Said pair of compression rollers is preferably made of a highly conductive but non-magnetable material, for example copper or bronze. Also the rest of the instruments of a signal coil must, in practice, be necessarily selected to be non-magnetable material in order to ensure the homogeneity of a magnetic field to be positioned over a target.

The movement of said conductor size controllers 13 can be alternatively effected by means of hydraulic cylinders 16 made of a non-magnetic material, as illustrated in FIG. 5.

The above description has dealt with one basic embodiment of the apparatus of the invention. Other possible embodiments can be effected for coil designs of solenoid and Helmholz types. In the above embodiments, it is preferable to manufacture supports 2a and 2b so that they also provide a so-called static protection to prevent a target from connecting capacitively to the set of coils. Readjustment of the coil size and thus the conductor length also leads to the change of resonance frequency. For this reason, in addition to the mentioned coil arrangement, the resonance circuit must also be provided with a control capacitor by means of which the resonance circuit is excited either manually or automatically. A change in the coil size has also effect on the length and amplitude of an exciting radio-frequency pulse since, with the coil size diminishing, the exciting magnetic field generated by the coil is increasing. Thus, for example, the length and/or amplitude of a pulse that deflects the net magnetization 90° is decreasing. The coil arrangement can be fitted with an observation assembly, e.g. a loop antenna, for measuring the field strength and the measuring result can be applied for determining the pulse amplitude automatically.

The above actions, required by the changes in the size of a signal coil and to be effected as a result of such changes, can be readily and automatically taken into consideration e.g. by utilizing the control and proper programming carried out by means of a microprocessor. Operating the assembly is as simple as possible this way.

The invention is by no means limited to the described embodiment but, instead, a plurality of modifications to the invention are conceivable within the scope of the appended claims.

I claim:

1. An adjustable signal coil for a nuclear spin or NMR examination assembly, comprising
   a flexible conductor,
   means for supporting a conductor in a configuration of one or more turns to form a signal coil defining a volume therein to receive a target for examination;
   said supporting means including means for adjusting the signal coil to change the coil volume to correspond to different sizes of targets to be examined, and
   said adjusting means adjusting the signal coil in such a manner that different magnetic fields of the signal coil in the respective different coil volumes have substantially the same cross-section homogeneity.

2. An adjustable signal coil as claimed in claim 1 wherein said coil volume is generally cylindrical, and the adjusting means includes means for adjusting the coil to change both the diameter and length of the cylindrical coil volume in a manner to maintain a predetermined homogeneity and signal/noise ratio of the coil.

3. An adjustable signal coil as claimed in claim 1 wherein said supporting means includes a pair of guide and profile supports containing the conductor forming the signal coil, and wherein said adjusting means includes means for selectively moving the guide and profile supports relative to each other so as to change the coil volume.

4. An adjustable signal coil as claimed in claim 3 wherein the guide and profile supports each have a plurality of guideways and a plurality of guides movably mounted in the respective guideways for forming a conductor turn, and said adjusting means includes means for moving the guides in the guideways to change the length of the conductor turn or turns to maintain magnetic field homogeneity.

5. An adjustable signal coil as claimed in claim 1 wherein said adjusting means includes means for changing the length of the conductor forming the turn or turns of the signal coil, and conductor tightening means for winding up extra conductor when the size of the turn or turns is decreased and for supplying conductor when the size of the turn or turns is increased.

* * * * *